(12) United States Patent
Hsieh et al.

(10) Patent No.: US 12,727,277 B2
(45) Date of Patent: Sep. 1, 2026

(54) IMAGE SENSOR DEVICE AND METHODS OF FORMING THE SAME

(71) Applicant: TAIWAN SEMICONDUCTOR MANUFACTURING COMPANY, LTD., Hsinchu (TW)

(72) Inventors: Feng-Chien Hsieh, Pingtung County (TW); Yun-Wei Cheng, Taipei city (TW); Wei-Li Hu, Tainan city (TW); Kuo-Cheng Lee, Tainan city (TW); Cheng-Ming Wu, Tainan city (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 454 days.

(21) Appl. No.: 18/211,401

(22) Filed: Jun. 19, 2023

(65) Prior Publication Data

US 2024/0421174 A1 Dec. 19, 2024

(51) Int. Cl.
*H10F 39/00* (2025.01)
*H10F 39/12* (2025.01)

(52) U.S. Cl.
CPC ......... *H10F 39/811* (2025.01); *H10F 39/024* (2025.01); *H10F 39/199* (2025.01); *H10F 39/8057* (2025.01)

(58) Field of Classification Search
CPC .. H10F 39/199; H10F 39/8057; H10F 39/024; H10F 39/807; H10F 39/811
See application file for complete search history.

(56) References Cited

U.S. PATENT DOCUMENTS

| | | | | |
|---|---|---|---|---|
| 8,405,182 | B2 | 3/2013 | Chou et al. | |
| 2012/0086094 | A1* | 4/2012 | Watanabe | H10F 77/40 257/E31.127 |
| 2014/0263962 | A1* | 9/2014 | Ahn | H10F 39/12 250/208.1 |
| 2021/0225916 | A1* | 7/2021 | Hsieh | H10F 39/8057 |
| 2022/0367549 | A1 | 11/2022 | Hsieh et al. | |
| 2022/0384497 | A1 | 12/2022 | Hsieh et al. | |
| 2023/0057857 | A1* | 2/2023 | Lim | H10F 39/8057 |

OTHER PUBLICATIONS

U.S. Appl. No. 17/887,983, filed Aug. 15, 2022.

* cited by examiner

*Primary Examiner* — William B Partridge
*Assistant Examiner* — Alexandre X Ramirez
(74) *Attorney, Agent, or Firm* — NZ Carr Law Office

(57) ABSTRACT

An image sensor device and methods of forming the same are described. In some embodiments, the device includes a substrate, a contact pad structure extending from a contact pad region to a black level correction region, a dielectric layer disposed over the substrate in the black level correction region, and a light blocking structure disposed on and through the dielectric layer in the black level correction region. A first portion of the contact pad structure disposed in the black level correction region is in contact with the light blocking structure, and the light blocking structure is in contact with the substrate.

20 Claims, 20 Drawing Sheets

174B
194

X
Y
174B
194

X
Y

IMAGE SENSOR DEVICE AND METHODS OF FORMING THE SAME

BACKGROUND

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. An example of an image sensor is a backside illuminated (BSI) image sensor, which detects radiation from a "backside" of a substrate of the BSI image sensor.

Improvements have been made to semiconductor image sensors. For example, power consumption may be lowered to achieve smaller dimensions and high performance. However, lowered power consumption can lead to reduced full-well capacity (FWC). Therefore, an improved image sensor is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
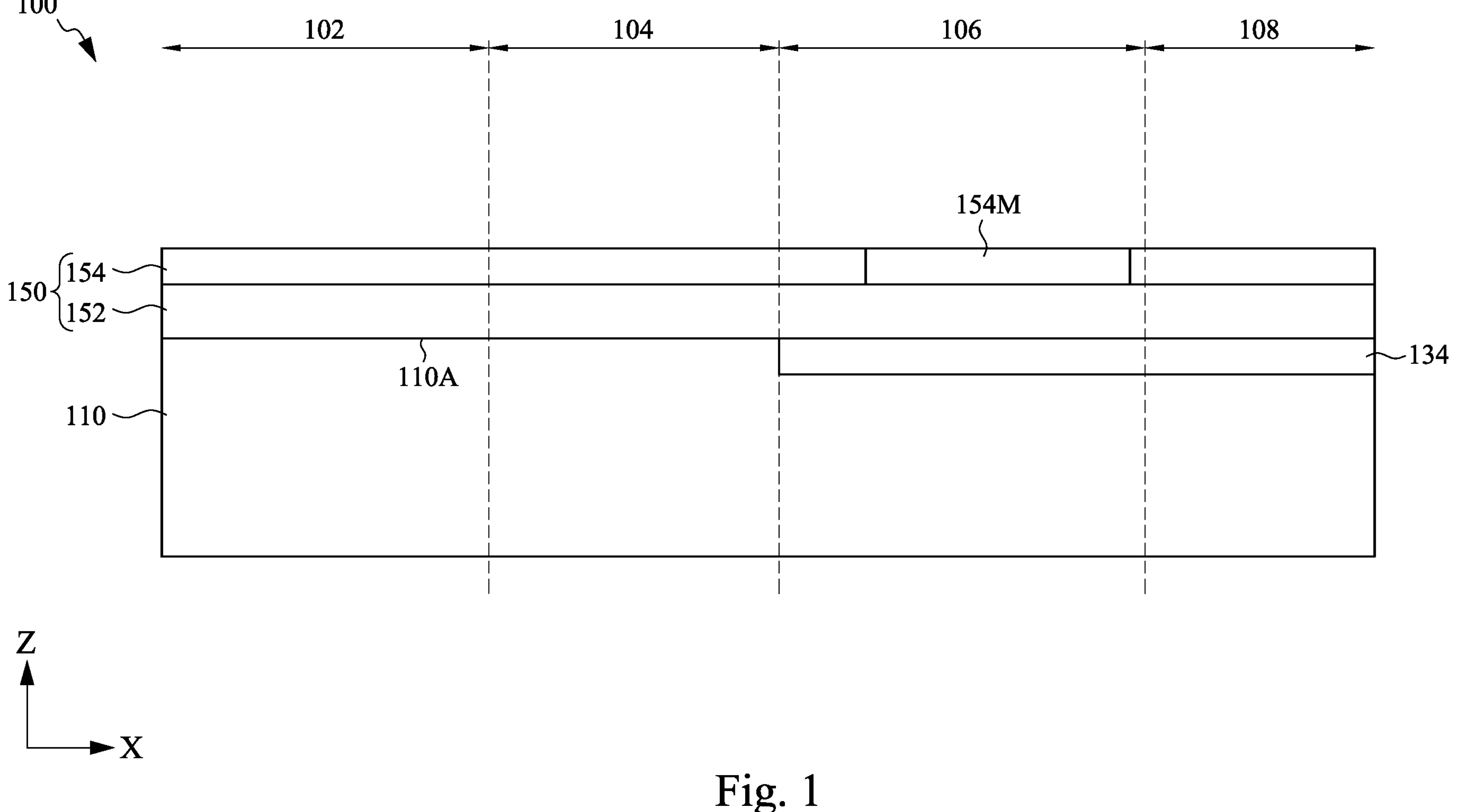
FIGS. 1-13 illustrates a method for forming an image sensor device at various intermediate stages of manufacturing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor device including a contact pad structure extending from the contact pad region to the black level correction (BLC) region and the methods of forming the same are provided in accordance with some embodiments of the present disclosure. Plural intermediate stages of manufacturing the image sensor device are illustrated. Throughout the various views and illustrative embodiments, like reference numbers are used to designate like elements.

FIGS. 1-13 illustrate a method for forming an image sensor device 100 at various intermediate stages of manufacture according to some embodiments of the present disclosure. For simplicity, some components of the image sensor device 100 are omitted. The illustration is merely exemplary and is not intended to be limiting beyond what is specifically recited in the claims that follow. It is understood that additional operations may be provided before, during, and after the operations shown by FIGS. 1-13, and some of the operations described below can be replaced or eliminated for additional embodiments of the method. The order of the operations/processes may be interchangeable.

As shown in FIG. 1, the image sensor device 100 may include a pixel array region 102, a black level correction (BLC) region 104, a contact pad region 106, and an alignment mark region 108. The dashed lines in FIGS. 1-13 designate the approximate boundaries between the regions 102-108. The photosensitive pixels (not shown) are formed in the pixel array region 102. The photosensitive pixels (not shown) are formed in the BLC region 104 and serve as reference pixels that are used to generate reference black level signals, thereby establishing a baseline of an intensity of light for the image sensor device 100. The contact pad region 106 can include one or more contact pad structures through which electrical connections between the image sensor device 100 and external circuit can be established.

As shown in FIG. 1, photosensitive pixels (not shown) are formed in a substrate 110. The substrate 110 may include, for example, bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe. GaAsP, AlInAs, AlGaAs, GaInAs, GaInP, and/or GaInAsP; or combinations thereof. Other substrates, such as multi-layered or gradient substrates, may also be used.

The photosensitive pixels are formed at the front surface 110A of the substrate 110. The photosensitive pixels may include respective photosensitive region (not shown), which may be formed, for example, by implanting suitable impurity ions into the substrate 110 from the front surface 110A of the substrate 110. In some embodiments, the impurity ions may be implanted in an epitaxial layer (not shown) within the substrate 110. The photosensitive regions are configured to covert light signals (e.g., photons) to electrical signals, and may be PN junction photo-diodes, PNP photo-transistors, NPN photo-transistors, or the like. For example, the photosensitive regions may include an n-type implantation region formed within a p-type semiconductor layer (e.g., at least a portion of the substrate 110). In such embodiments, the p-type semiconductor layer may isolate and reduce electrical cross-talk between adjacent photo-active regions of the photosensitive pixels. In some embodiments, the photosensitive regions may include a p-type implantation region formed within an n-type semiconductor layer (e.g., at least a portion of the substrate 110).

Prior to the formation of the photosensitive region, isolation structures (not shown) may be formed at the front surface 110A of the substrate 110. In some embodiments, the isolation structures may include shallow trench isolation (STI) structures. In some embodiments, the STI structures may be formed by patterning the front surface 110A of the substrate 110 to form trenches in the substrate 110 and filling the trenches with suitable dielectric materials to form the STI structures. The dielectric materials may include silicon oxides. In some embodiments, the substrate 110 is patterned using suitable photolithography and etching process. In other embodiments, the isolation structures 132 may include various doped regions formed using suitable implantation processes. In some embodiments, an isolation layer 134 may be formed in the contact pad region 106 and the alignment mark region 108. The isolation layer 134 may be formed simultaneously with the isolation structures. In some other embodiments, the isolation structures may be omitted.

An interconnect structure 150 may be formed on the front surface 110A of the substrate 110, thereby forming electrical circuits with the photosensitive pixels. The interconnect structure 150 may include an ILD layer 152 and/or IMD layers 154 containing conductive features (e.g., conductive lines and vias including copper, aluminum, tungsten, combinations thereof, and the like) formed using any suitable method, such as damascene, dual damascene, or the like. For example, the interconnect structure 150 include a conductive line 154M as shown in FIG. 1. The ILD layer 152 and IMD layers 154 may include low-k dielectric materials having k values, for example, lower than about 4.0 or even 2.0 disposed between such conductive features. In some embodiments, the ILD layer 152 and IMD layers 154 may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spinning, chemical vapor deposition (CVD), plasma-enhanced CVD (PECVD), or the like.

In some embodiments, prior to the formation of the interconnect structure 150, one or more active and/or passive devices may be formed on the front surface 110A of the substrate 110 in addition to the photosensitive pixels including the photosensitive regions, the transfer gate transistors (not shown), and the floating diffusion capacitors (not shown). The one or more active and/or passive devices may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for illustrative purposes only and are not meant to limit the present disclosure in any manner. Other circuitry may be used as appropriate for a given application.

Figure 2:
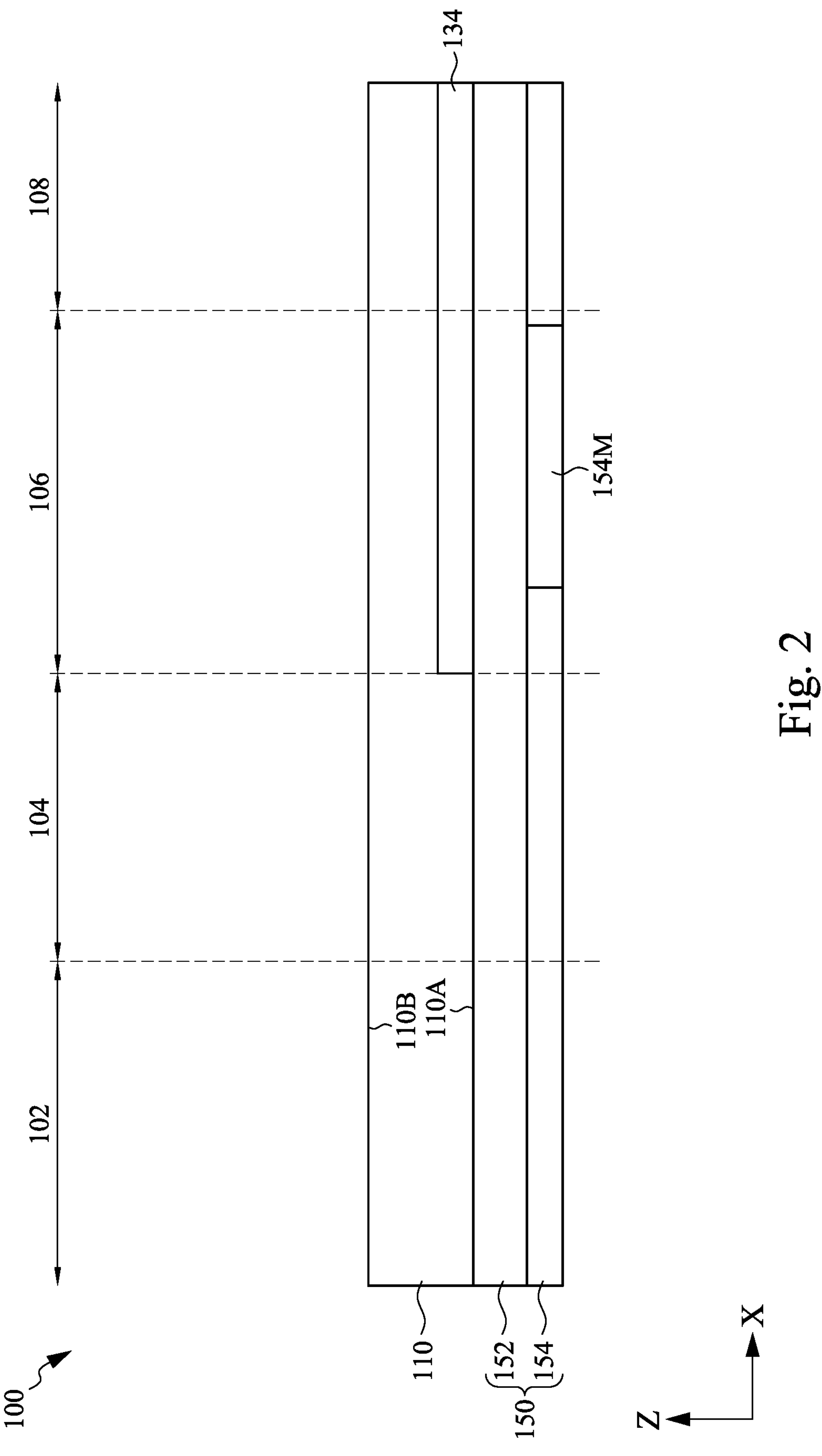

As shown in FIG. 2, the structure of FIG. 1 is flipped and optionally bonded to a carrier substrate (not shown) such that the front surface 110A of the substrate 110 faces the carrier substrate and the back surface 110B of the substrate 110 is exposed for further processing. In some embodiments, the carrier substrate may provide mechanical support for processing steps performed on the back surface 110B of the substrate 110. In some embodiments, the carrier substrate may be formed of silicon or glass and may be free from electrical circuitry formed thereon. In such embodiments, the carrier substrate provides temporary support and is de-bonded from the image sensor device 100 after completing the process steps performed on the back surface 110B of the substrate 110. In other embodiments, the carrier substrate may include a semiconductor substrate, one or more active devices (not illustrated) on the semiconductor substrate, and an interconnect structure (not illustrated) over the one or more active devices. In such embodiments, in addition to providing the mechanical support, the carrier substrate may provide additional electrical functionality to the image sensor device 100 depending on design requirements.

After flipping over the structure, a thinning process may be performed on the back surface 110B of the substrate 110 to thin the substrate 110. In some embodiments, the thinning process serves to allow more light to pass through from the back surface 110B of substrate 110 to the photosensitive regions of the photosensitive pixels without being absorbed by the substrate 110. The thinning process may be implemented by using suitable techniques such as grinding, polishing, and/or chemical etching.

Figure 3:
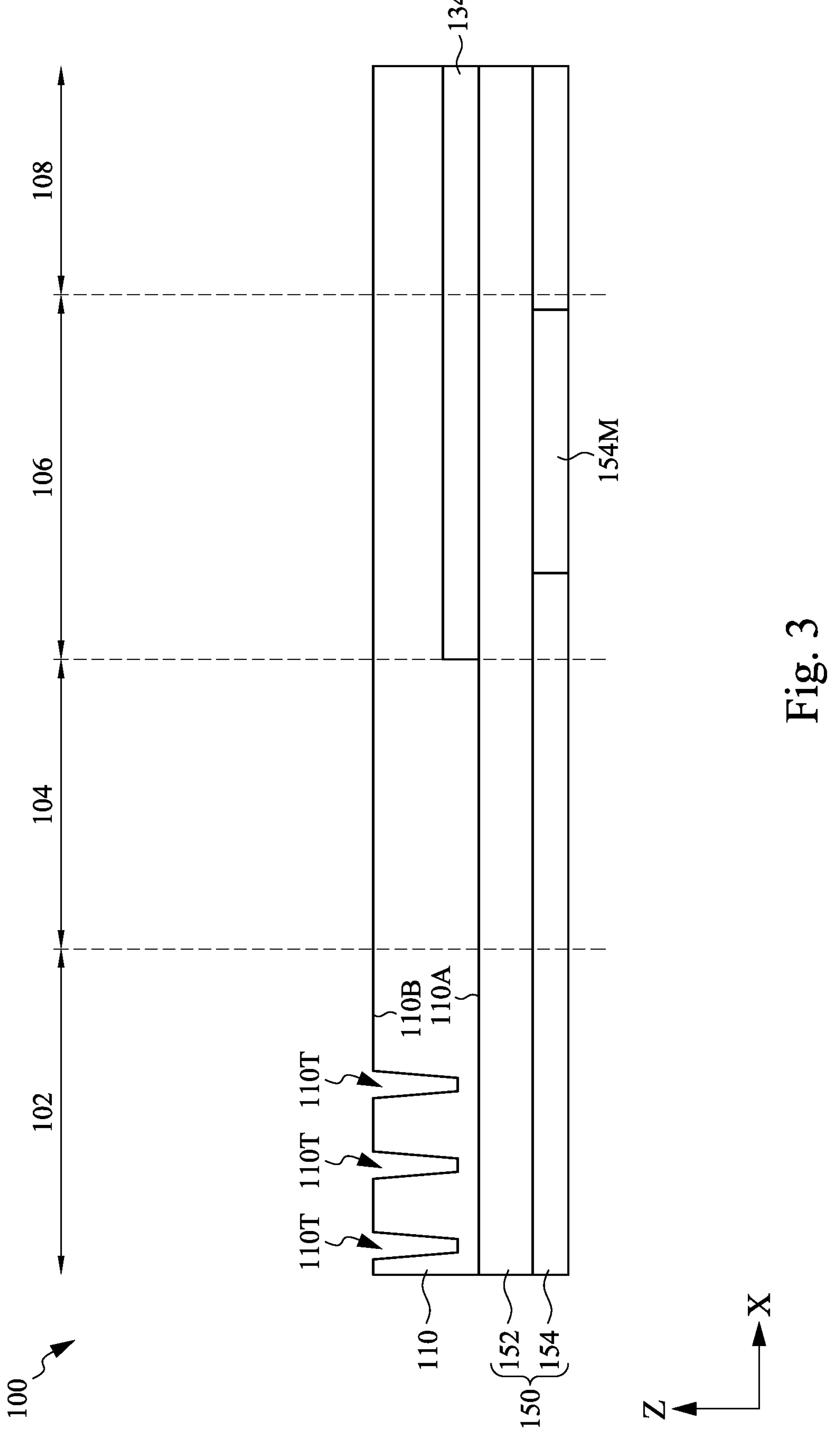

As shown in FIG. 3, the back surface 110B of the substrate 110 is patterned to form plural trenches 110T in the substrate 110. In some embodiments, the back surface 110B of the substrate 110 is patterned using a suitable anisotropic wet etching process, while using a patterned mask (e.g., photoresist or a non-photosensitive material, such as silicon nitride) as an etch mask. In some embodiments in which the substrate 110 is formed of silicon, the anisotropic wet etch may be performed using potassium hydroxide (KOH), ethylenediamine pyrocatechol (EDP), tetramethylammonium hydroxide (TMAH), or similar. The patterned mask may be removed after the etching process. In some embodiments in which the patterned mask is formed of a photoresist, the patterned mask may be removed using an ashing process followed by a wet clean process. In other embodiments in which the patterned mask is formed of a non-photosensitive material, the patterned mask may be removed using a suitable etching process.

Figure 4:
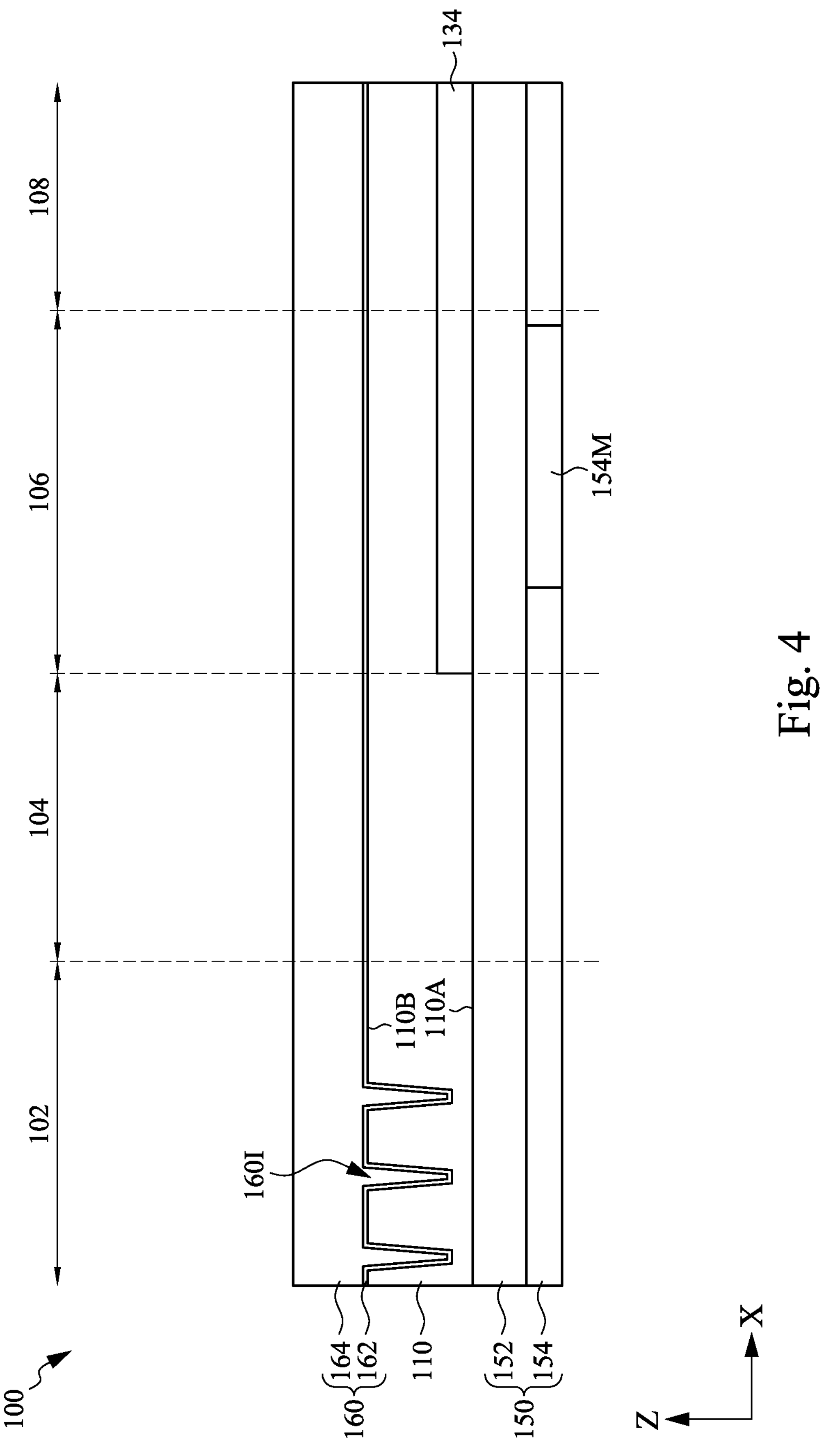

As shown in FIG. 4, after forming the trenches 110T, a dielectric layer 160 is formed on the back surface 110B of the substrate 110, thereby filling the trenches 110T. The dielectric layer 160 may include a charge accumulation layer 162 conformally formed on the back surface 110B of the substrate 110 and a buffer layer 164 over the charge accumulation layer 162.

In some embodiments, the charge accumulation layer 162 may include one or plural high-k dielectric materials. For example, the charge accumulation layer 162 may include a $HfO_2$ layer and a $Ta_2O_5$ layer over the $HfO_2$ layer. The charge accumulation layer 162 helps to accumulate negative or positive charges in the substrate 110 to an interface between the charge accumulation layer 162 and the substrate 110 to form electric dipoles, which functions as a carrier barrier to trap defects such as dangling bonds. The configuration of the charge accumulation layer 162 may reduce leakage current of the image sensor devices.

In some embodiments, the buffer layer 164 may be formed of silicon oxide, although other suitable dielectric materials may be used. In some embodiments, the buffer layer 164 may be formed using ALD, CVD, PECVD, the like, or a combination thereof. In some embodiments, the charge accumulation layer 162 and the buffer layer 164 is planarized using a grinding process, a chemical mechanical polishing (CMP) process, an etching process, or the like. Through the configuration, portions of the layers 162 and 164 in the trenches 110T of the substrate 110 form the isolation structures 160I between neighboring photosensitive pixels. The isolation structures 160I may prevent electrical cross-talk between the photosensitive pixels. The isolation structures 160I may be referred to as backside deep trench isolation (BDTI) structures. In some other embodiments, the charge accumulation layer 162 may be omitted.

Figure 5:
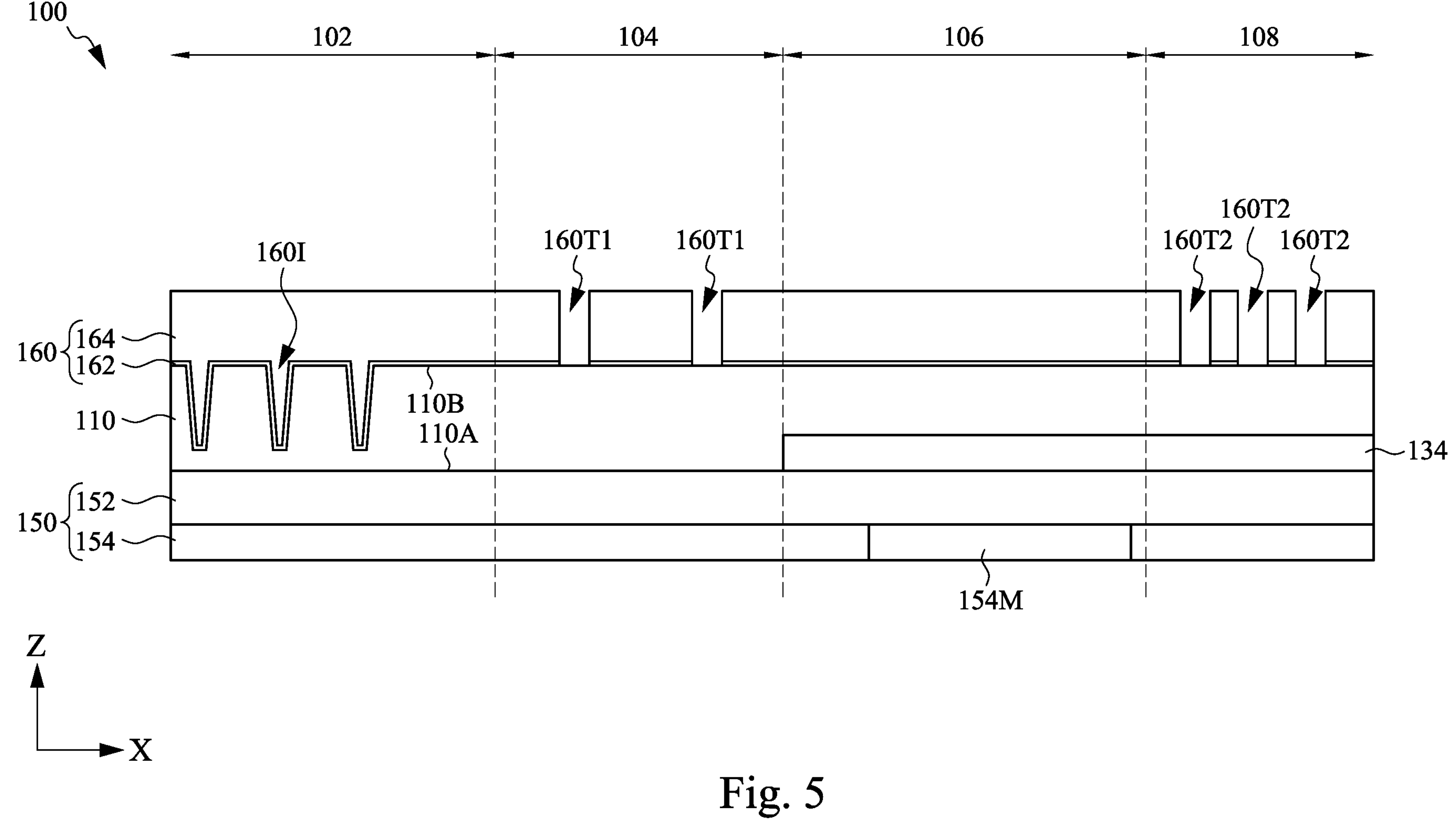

As shown in FIG. 5, the dielectric layer 160 is patterned to form one or more openings 160T1 and 160T2 that expose the back surface 110B of the substrate 110 in the BLC region 104 and the alignment mark region 108, respectively. In some embodiments, the dielectric layer 160 may be patterned using suitable photolithography and etching processes. For example, a photoresist is coated over the dielectric layer 160 and then patterned using photolithography techniques to expose portions of the dielectric layer 160 in the BLC region 104 and the alignment mark region 108. Subsequently, an etching process is performed to remove the exposed portions of the dielectric layer 160, thereby exposing the underlying substrate 110.

Figure 6:
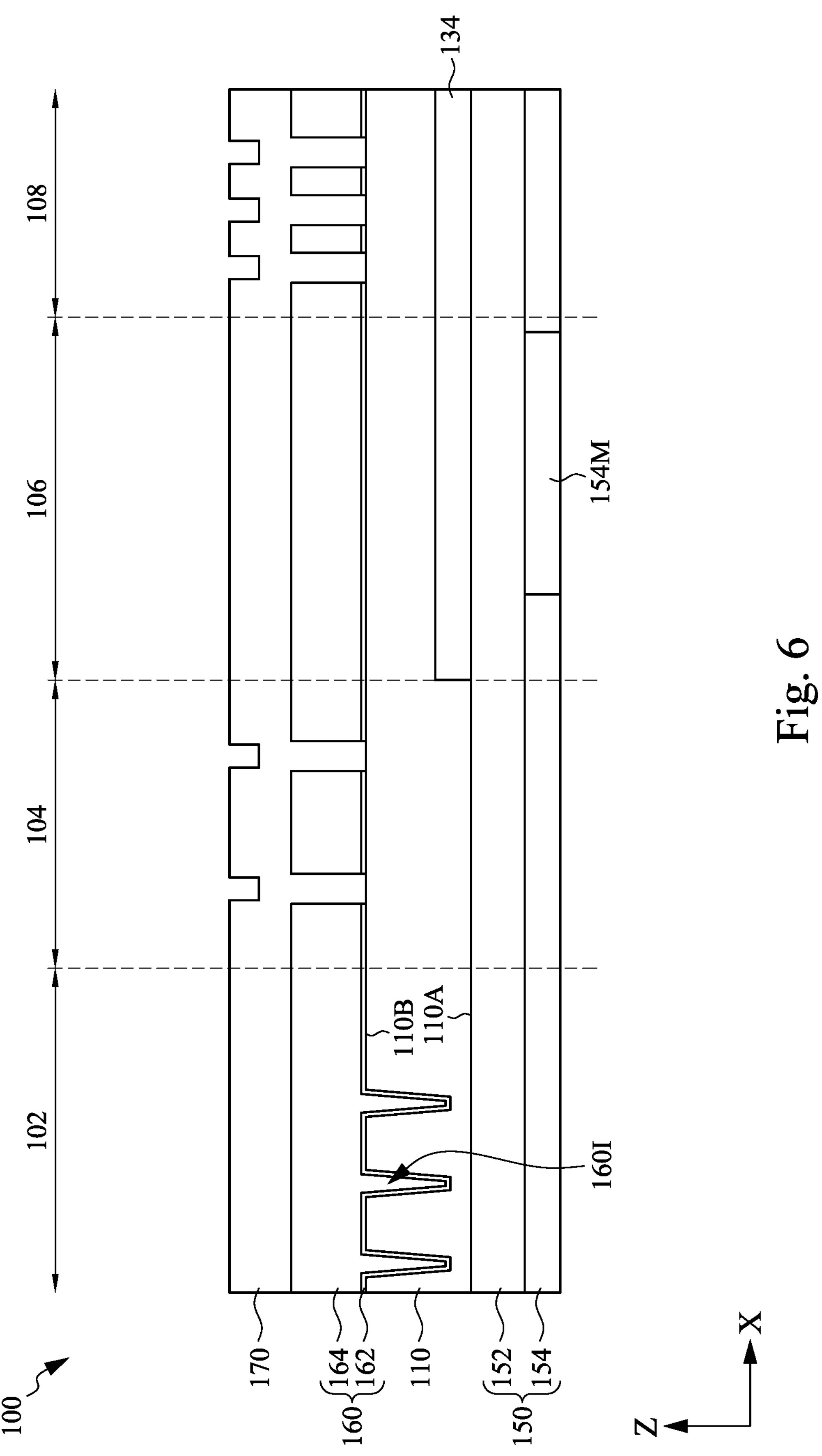

As shown in FIG. 6, a light blocking layer 170 is formed over the dielectric layer 160. The light blocking layer 170 may be a metal layer. In some embodiments, the light blocking layer 170 is made of a reflective metal material or a light absorption material. For example, the light blocking layer 170 may include Cu, Au, Ag, Al, Ni, W, alloys thereof, or the like and may be formed using PVD, plating, or the like. In some embodiments, prior to the formation of the light blocking layer 170, a barrier/adhesion layer (not shown) may be conformally formed over the dielectric layer 160. The barrier/adhesion layer may include titanium, titanium nitride, tantalum, tantalum nitride, or multilayers thereof and may be formed using PVD. CVD, MOCVD, plasma enhanced CVD (PECVD), atomic layer deposition (ALD), electroplating and/or the like. The light blocking layer 170 made of an electrically conductive material. In some embodiments, the light blocking layer 170 located in the BLC region 104 may include grooves corresponding to the openings 160T1. The grooves may be formed in a top surface of the light blocking layer 170.

Figure 7:
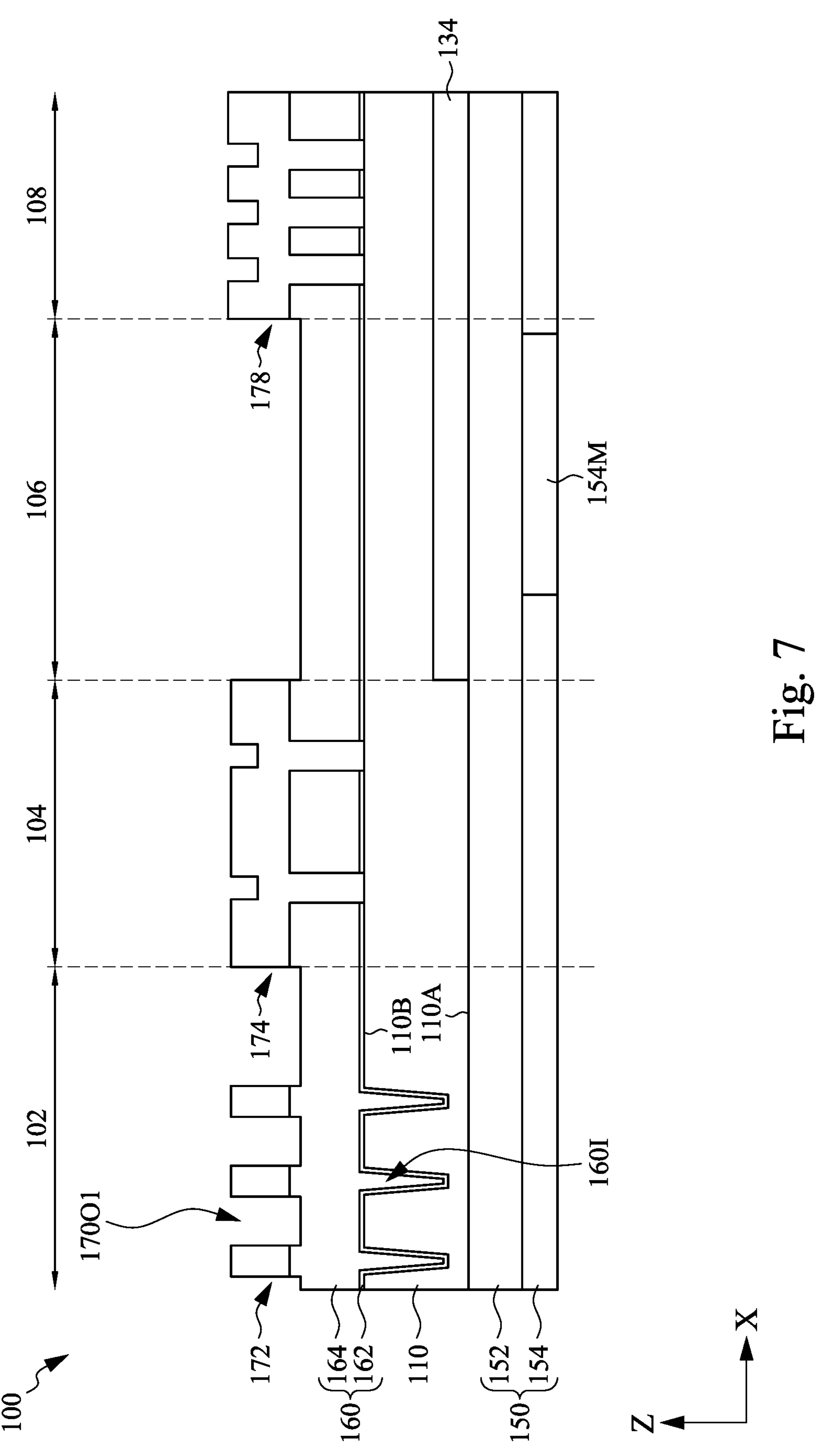

As shown in FIG. 7, the light blocking layer 170 (FIG. 6) is patterned into a light blocking grid 172 in the pixel array region 102, a light blocking structure 174 in the BLC region 104, and a light blocking structure 178 in the alignment mark region 108. The patterning process may include suitable photolithography and etching processes. For example, a patterned mask (e.g., photoresist) is formed over the light blocking layer 170 and exposing portions of the light blocking layer 170 in the pixel array region 102 and a portion of the light blocking layer 170 in the contact pad region 106. Subsequently, an etching process is performed to remove the exposed portions of the light blocking layer 170. The etching process may include wet etch, dry etch, or the combination thereof. For example, the etching process may include a dry etch using gas etchants such as $Cl_2$, HBr, $CF_4$, or the like. The etching process may be performed until the dielectric layer 160 is exposed. In some embodiments, the exposed portions of the dielectric layer 160 may be consumed by the etching process and thus are recessed to fall below the lateral interface between the light blocking layer 170 and the dielectric layer 160. Through the patterning process, the dielectric layer 160 is exposed through the openings 170O1 and 170O2 in the light blocking layer 170. In some embodiments, in the etching process, the BLC region 104 and the alignment mark region 108 are protected from etching, and the layers therein are not etched.

The light blocking structure 174 in the BLC region 104 blocks the light that otherwise would be received by the reference photosensitive pixels. The light blocking structure 174 may be electrically coupled to the substrate 110, for example, the light blocking structure 174 is in contact with the back surface 110B of the substrate 110. Such electrical coupling provides grounding. The grounding may release unwanted charges in the BLC region 104. In some embodiments, the light blocking structure 174 may be a ring-shaped structure in a top view that laterally surrounds or encircle the pixel array region 102.

The light blocking grid 172 has the openings 170O1 aligned with respective photosensitive pixels. For example, in some embodiments, walls of the light blocking grid 172 may encircle each active photosensitive pixel as viewed from top. Through the configuration, the light blocking grid 172 prevents optical cross-talk between neighboring active photosensitive pixels.

The light blocking structure 178 located in the alignment mark region 108 may be referred to as an alignment mark (e.g., a scribe lane primary mark (SPM) or an overlay (OVL) mark). In some embodiments, the light blocking structure 178 may include grooves corresponding to the openings 160T2. For example, grooves formed in light blocking structure 178 allow for alignment correction to detect misalignment during a photolithography process. In alternative embodiments, the entirety of the light blocking layer 170 in alignment mark region 108 is removed by the patterning process.

Figure 8:
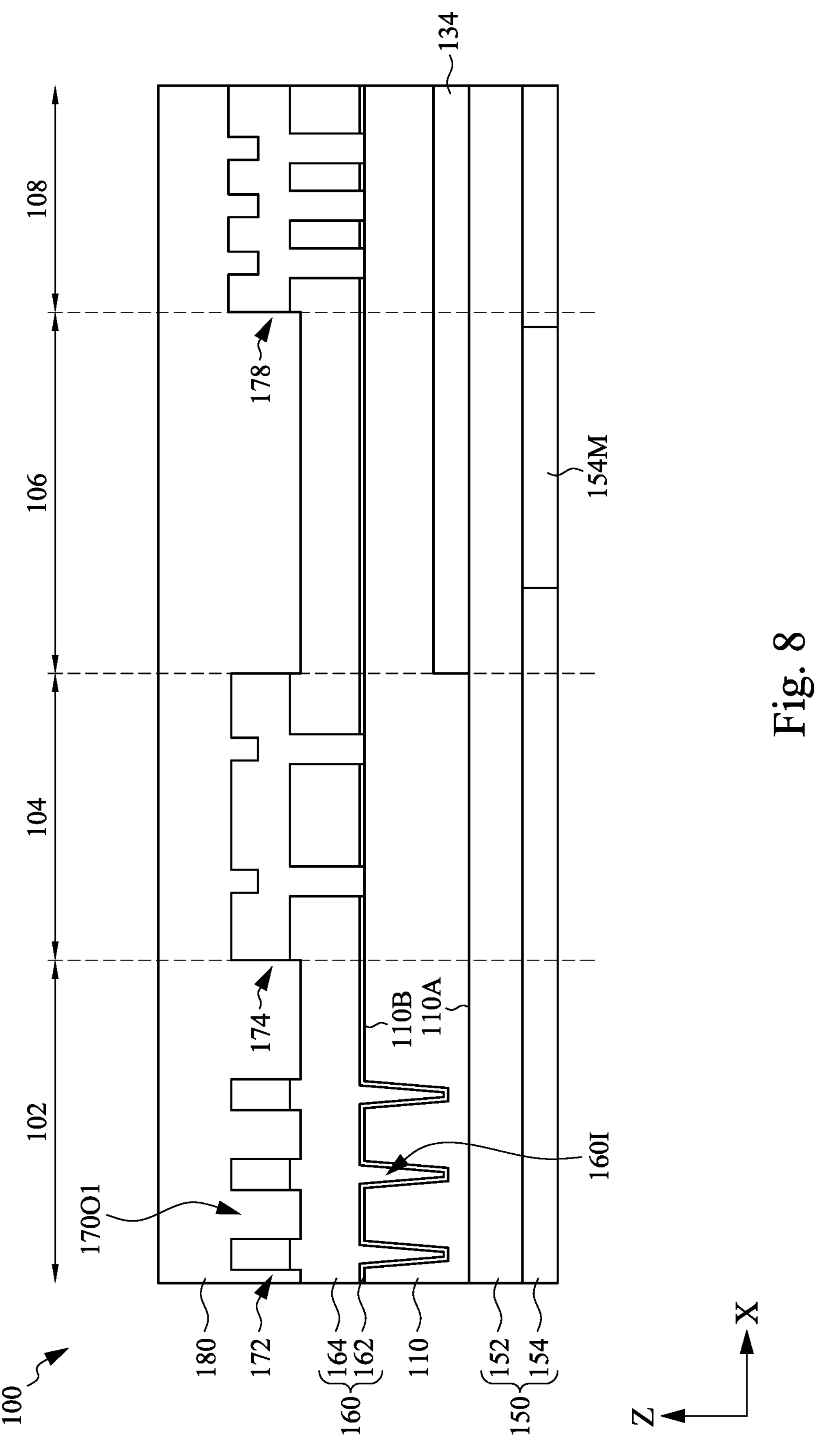

As shown in FIG. 8, a dielectric layer 180 is formed over the light blocking grid 172, the light blocking structures 174, 178, and the dielectric layer 160. In some embodiments, the dielectric layer 180 may be formed using similar materials and methods as the buffer layer 164 described above with reference to FIG. 4 and the description is not repeated herein. In some embodiments, the dielectric layer 180 and the buffer layer 164 may be formed of the same material. In other embodiments, the dielectric layer 180 and the buffer layer 164 may be formed of different materials. Subsequently, the dielectric layer 180 is planarized using a grinding process, a chemical mechanical polishing (CMP) process, an etching process, or the like.

Figure 9:
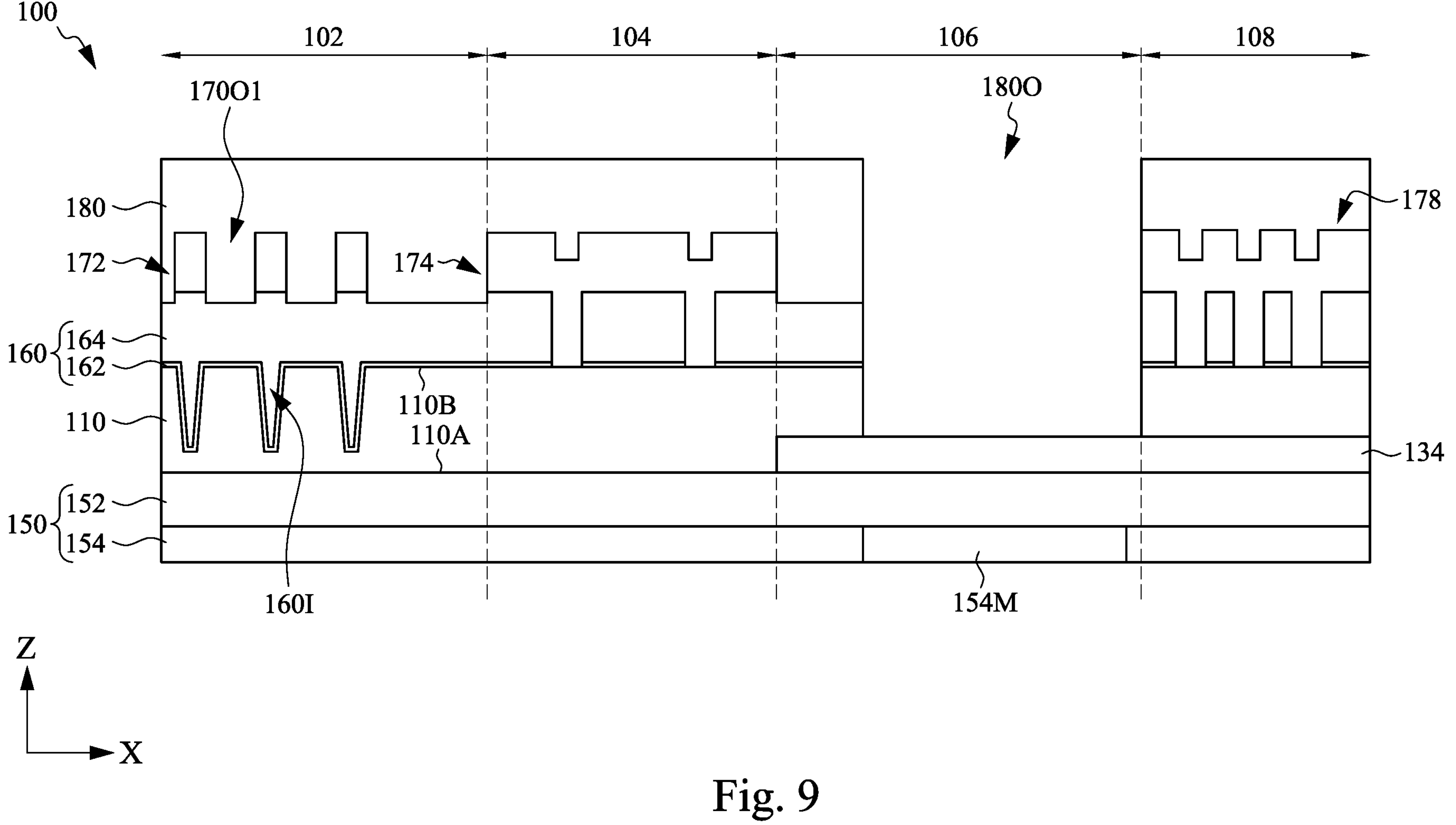
Figure 10:
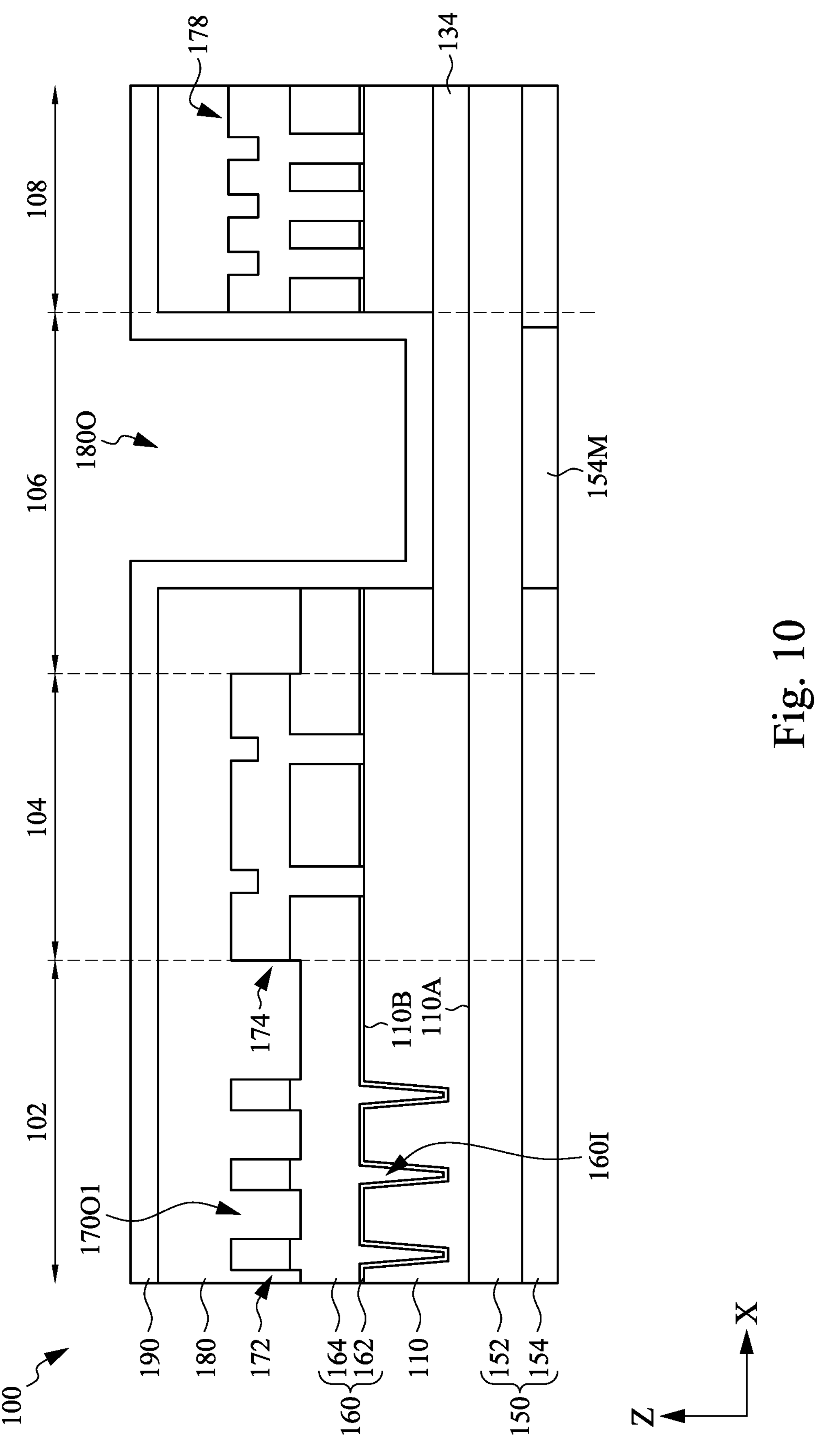

As shown in FIG. 9, an etching process is performed to remove a portion of the dielectric layer 180, a portion of the dielectric layer 160, and a portion of the substrate 110 in the contact pad region 106, thereby forming an opening 180O in the contact pad region 106. The isolation layer 134 is exposed in the opening 180O, as shown in FIG. 9. Subsequently, a buffer oxide layer 190 is formed over a remaining portion of the dielectric layer 180 in the regions 102, 104, 106, and 108, and extends into the opening 180O on the exposed portion of the isolation layer 134, as shown in FIG. 10.

Figure 11:
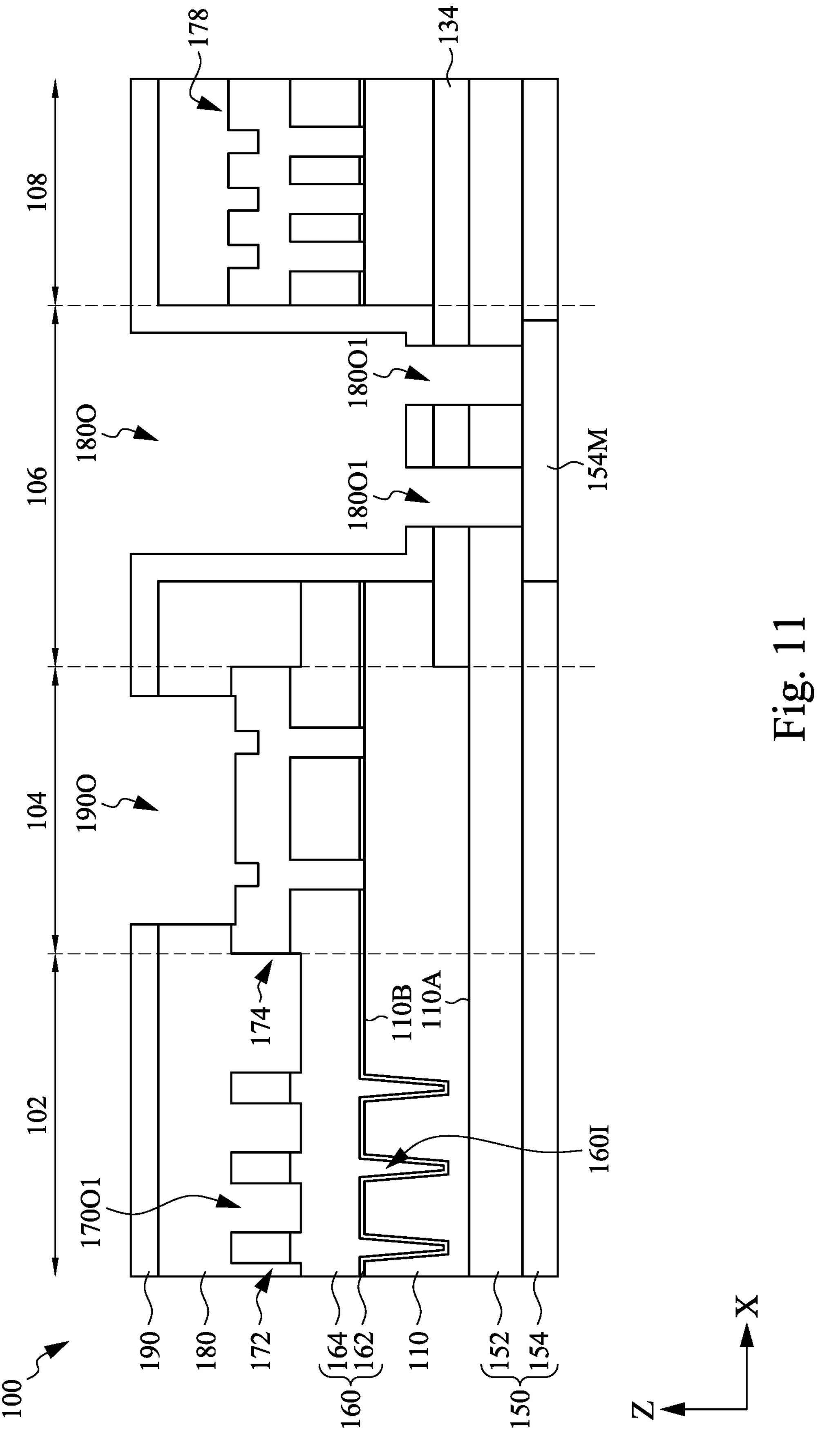

As shown in FIG. 11, the buffer oxide layer 190 and the underlying dielectric materials (e.g., the isolation layer 134 and the ILD layer 152) in the contact pad region 106 are patterned to form openings 180O1 to expose the conductive lines 154M of the interconnect structure 150. The buffer oxide layer 190 and the underlying dielectric layer 180 in the BLC region 104 are also patterned to form an opening 190O to expose the light blocking structure 174. The patterning of materials in both regions 104, 106 may be performed simultaneously.

Figure 12:
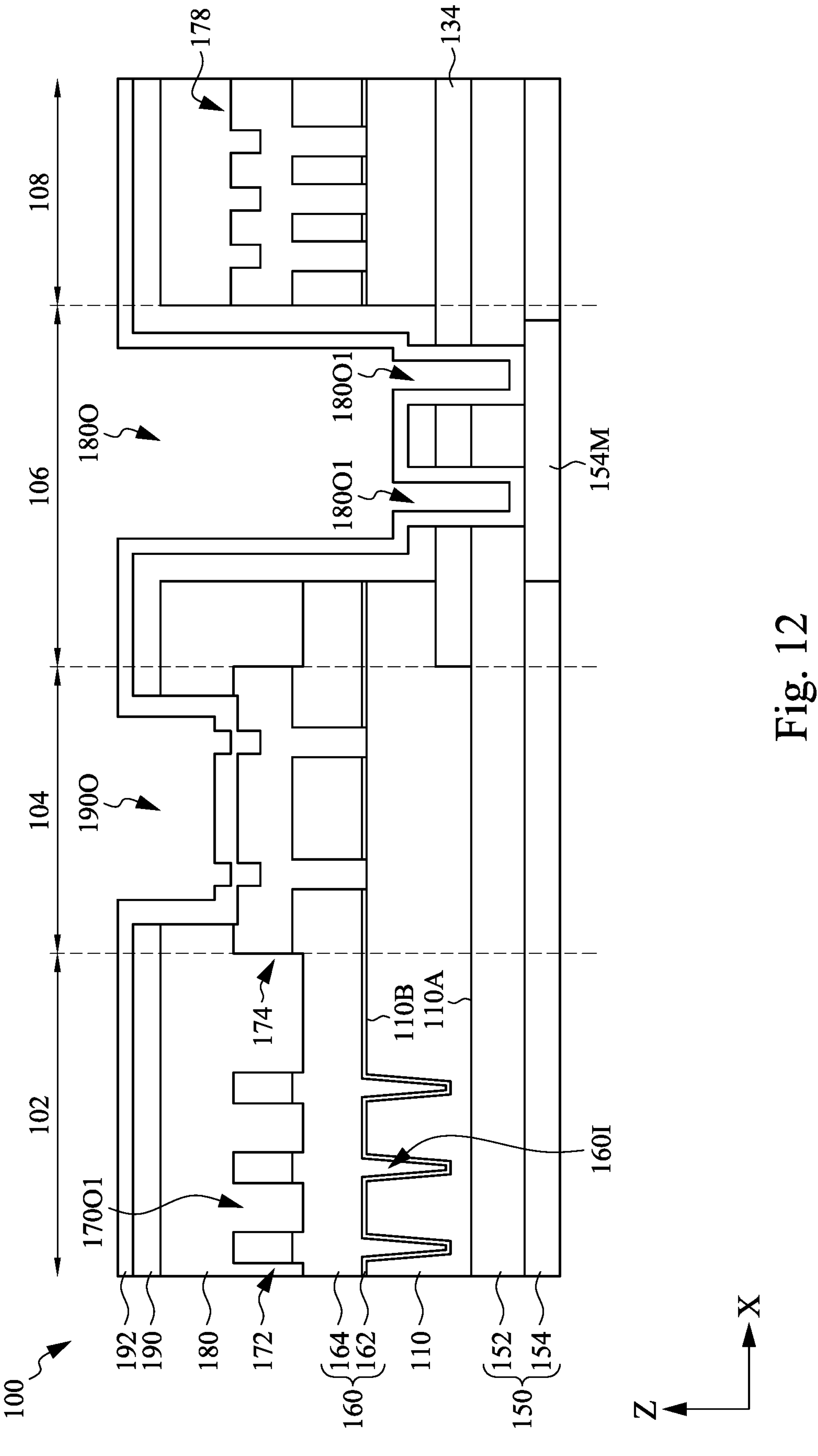
Figure 13:
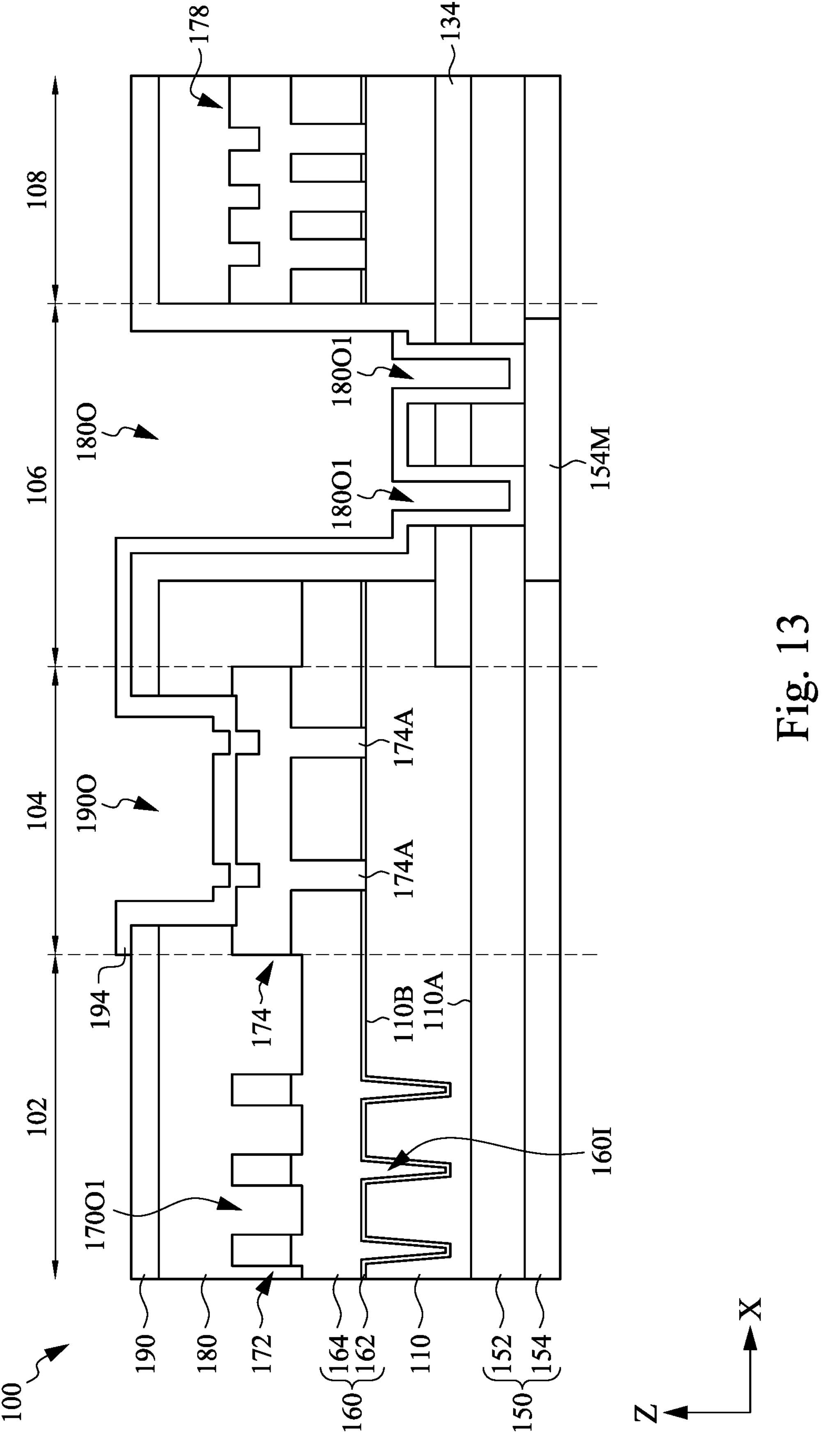

Subsequently, a conductive layer 192 is formed on buffer oxide layer 190 in regions 102, 108, in the opening 190O in the BLC region 104, and in the openings 180O, 180O1 in the contact pad region 106, as shown in FIG. 12. As shown in FIG. 13, the conductive layer 192 is patterned to form a contact pad structure 194. In some embodiments, the portions of the conductive layer 192 disposed in the pixel array region 102 and the alignment mark region 108 are removed, and the remaining conductive layer 192, or the contact pad structure 194, is disposed in the BLC region 104 and the contact pad region 106. As described above, the light blocking structure 174 is in contact with the back surface 110B of the substrate 110, and such electrical coupling provides grounding that may release unwanted charges in the BLC region 104. As shown in FIG. 13, the portion of the contact pad structure 194 disposed in the BLC region 104 is in contact with the light blocking structure 174. In some embodiments, the portion of the contact pad structure 194 disposed in the BLC region 104 fills the grooves formed in the top surface of the light blocking structure 174. The portion of the contact pad structure 194 disposed in the BLC region 104 is in contact with the buffer oxide layer 190 and the dielectric layer 180. The portion of the contact pad structure 194 located in the contact pad region 106 is electrically coupled to the exposed conductive lines 154M and electrically isolated from the sidewall of the substrate 110 by the buffer oxide layer 190. The portion of the contact pad structure 194 located in the contact pad region 106 is used for forming an electrical connection, such as a wire bonding (not shown), to electrically couple to the circuits and the photosensitive pixels. The portion of the contact pad structure 194 located in the contact pad region 106 may be coupled to the photosensitive pixels through interconnect structure 150.

Subsequent processes may be performed to form the image sensor device 100. For example, a color filter layer (not shown) may be formed over the dielectric layer 180 in the pixel array region 102. In some embodiments, the color filter layer includes plural color filters, aligned with respective active photosensitive pixels. The color filters may be used to allow specific wavelengths of light to pass while reflecting other wavelengths, thereby allowing the image sensor device 100 to determine the color of the light being received by the active photosensitive pixels. For example, the color filters may be a red, green, and blue filter as used in a Bayer pattern. Other combinations, such as cyan, yellow, and magenta, may also be used. The number of different colors of the color filters may also vary. The color filters may include a polymeric material or resin, such as polymethyl-methacrylate (PMMA), polyglycidyl-methacrylate (PGMA), or the like, which includes colored pigments.

Figure 14:
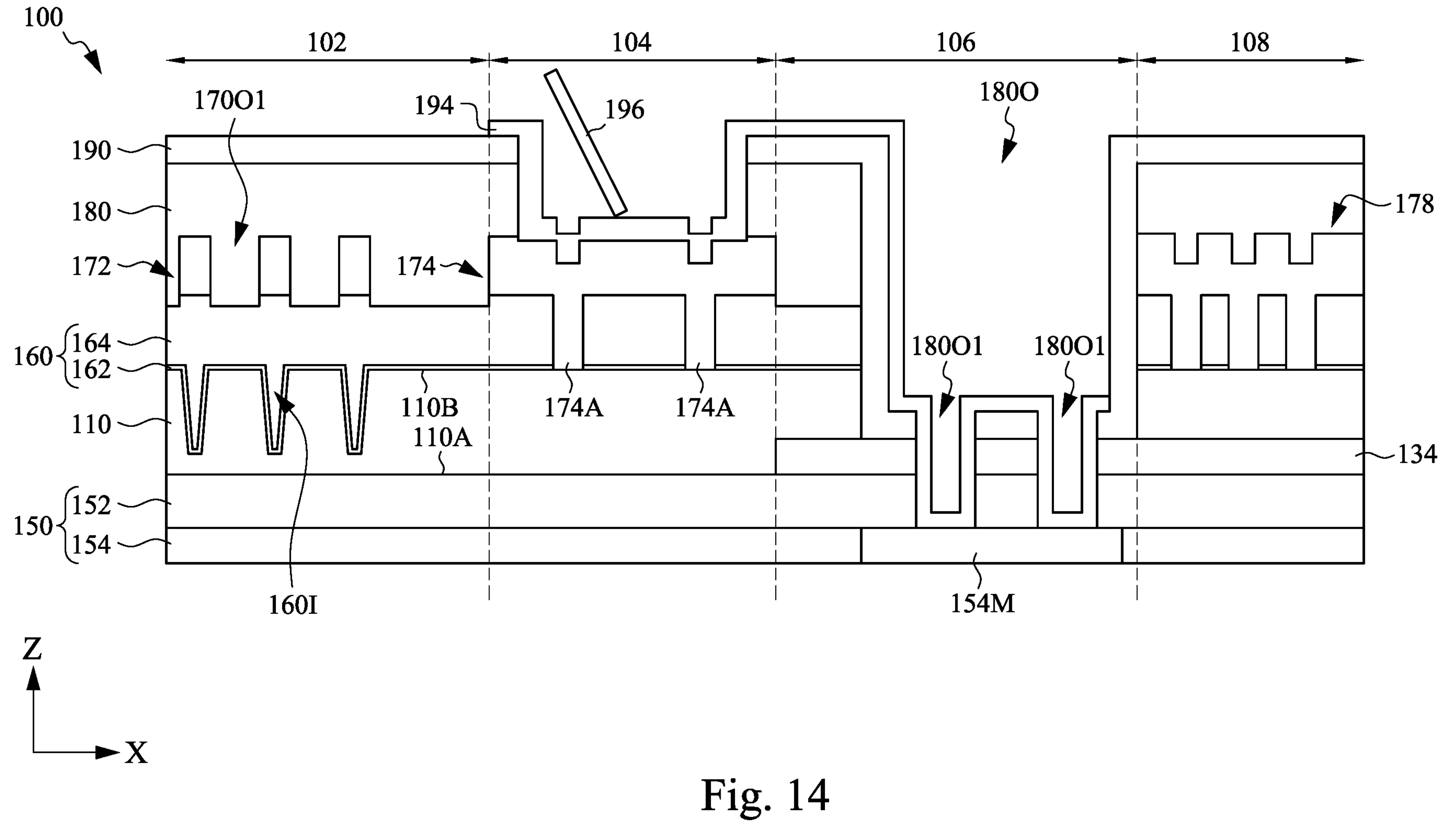
FIG. 14 illustrates a method to apply a negative voltage to the image sensor device shown in FIG. 13, in accordance with some embodiments.
Figure 15B:
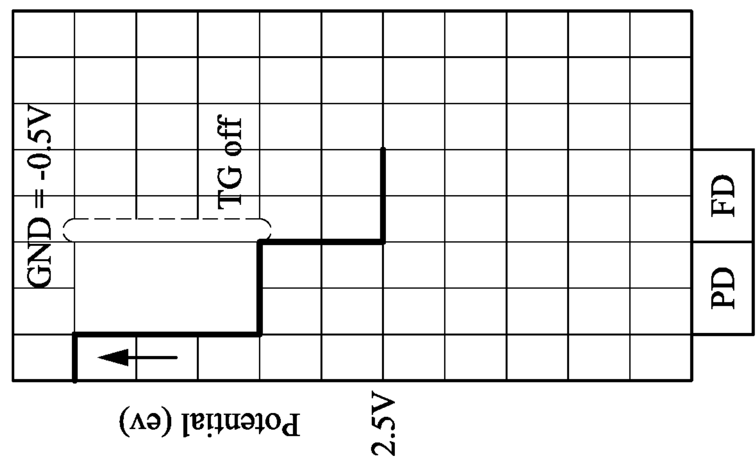
FIGS. 15A and 15B illustrate effects of applying a negative voltage to the ground with reduced power supply, in accordance with some embodiments.
Figure 15A:
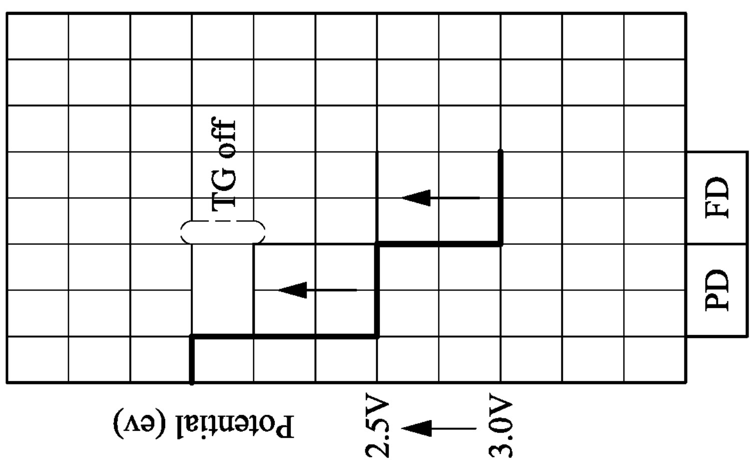

The portion of the contact pad structure 194 disposed in the BLC region 104 provides a location to apply a negative voltage to the ground, such as from about 0 v to −0.5 v. As shown in FIG. 14, during operation of the image sensor device 100 with reduced power supply, such as 2.5 v reduced from 3.0 v, a probe 196 is inserted into the image sensor device 100 and in contact with the portion of the contact pad structure 194 disposed in the BLC region 104, and the negative voltage applied to the ground by the probe 196 can increase the FWC by increasing energy barrier when the transfer gate (TG) is off. FIGS. 15A and 15B illustrates the effect of applying −0.5 v voltage to the ground with the reduced power supply. As shown in FIGS. 15A and 15B, when −0.5 v voltage is applied to the ground, the electrical potential is increased, which means the FWC is increased.

Figure 16B:
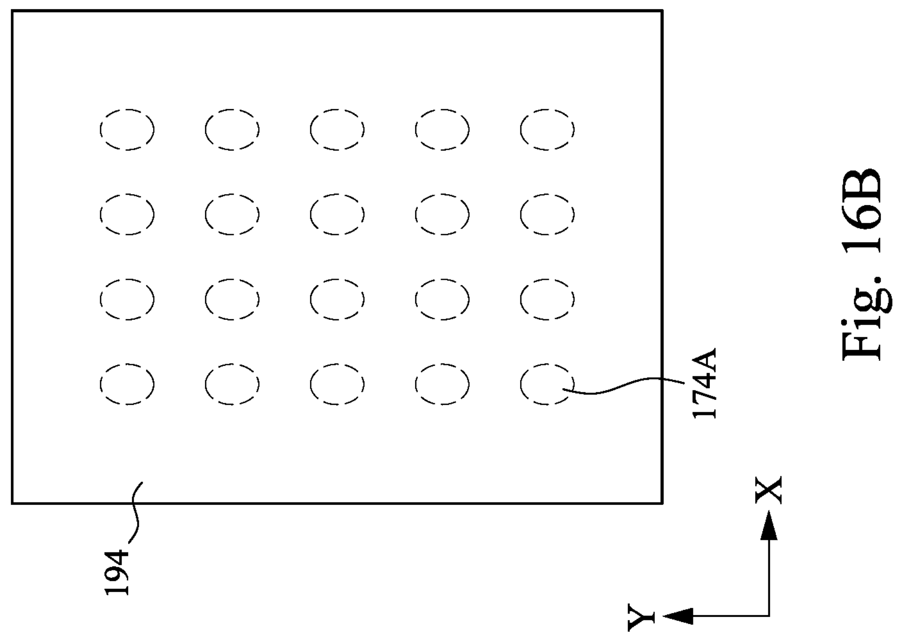
FIGS. 16A and 16B illustrate top views of a portion of a contact pad structure disposed over a light blocking structure of the image sensor device of FIG. 13, in accordance with some embodiments.
Figure 16A:
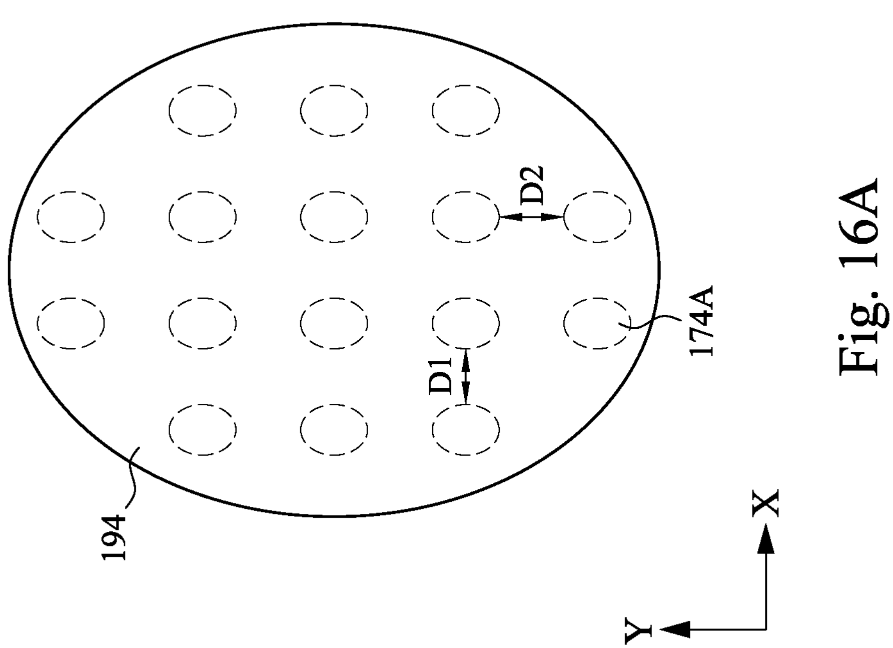

Referring back to FIG. 14, in some embodiments, the light blocking structure 174 includes portions 174A extending through the dielectric layer 160 and in contact with the substrate 110. In some embodiments, the light blocking structure 174 includes a plurality of portions 174A in contact with the substrate 110. As shown in FIGS. 16A and 16B, the portions 174A of the light blocking structure 174, which are shown in dashed lines because the portions 174A are located below the contact pad structure 194, may be arranged in a matrix. The remaining portion of the light blocking structure 174 is omitted for the sake of clarity. In some embodiments, each portion 174A has a diameter ranging from about 1 micron to about 10 microns. As shown in FIG. 16A, a distance D1 between adjacent portions 174A in the X direction ranges from about 0.5 microns to about 20 microns, and a distance D2 between adjacent portions 174A in the Y direction ranges from about 1 micron to about 10 microns. In some embodiments, as shown in FIG. 16A, the portion of the contact pad structure 194 located in the BLC region 104 may have an oval or circular shape and may surround the plurality of portions 174A. In some embodiments, the portion of the contact pad structure 194 located in the BLC region 104 may have a rectangular shape and may surround the plurality of portions 174A. The portions 174A may have any suitable shape and be arranged in any suitable pattern. The portion of the contact pad structure 194 located in the BLC region 104 may have any suitable shape.

Figure 17:
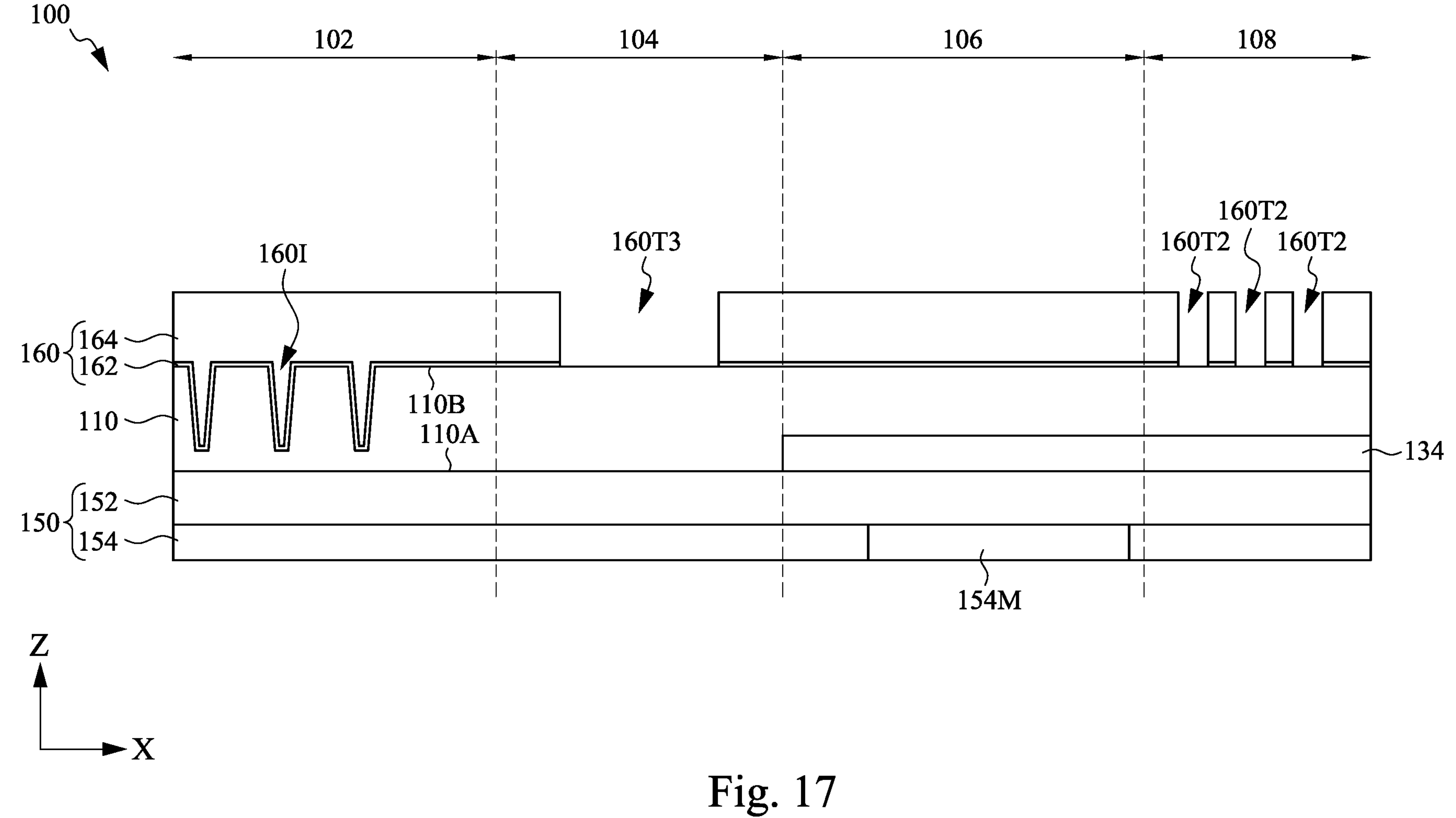
FIGS. 17 and 18 illustrates a method for forming an image sensor device at various intermediate stages of manufacturing, in accordance with alternative embodiments.
Figure 18:
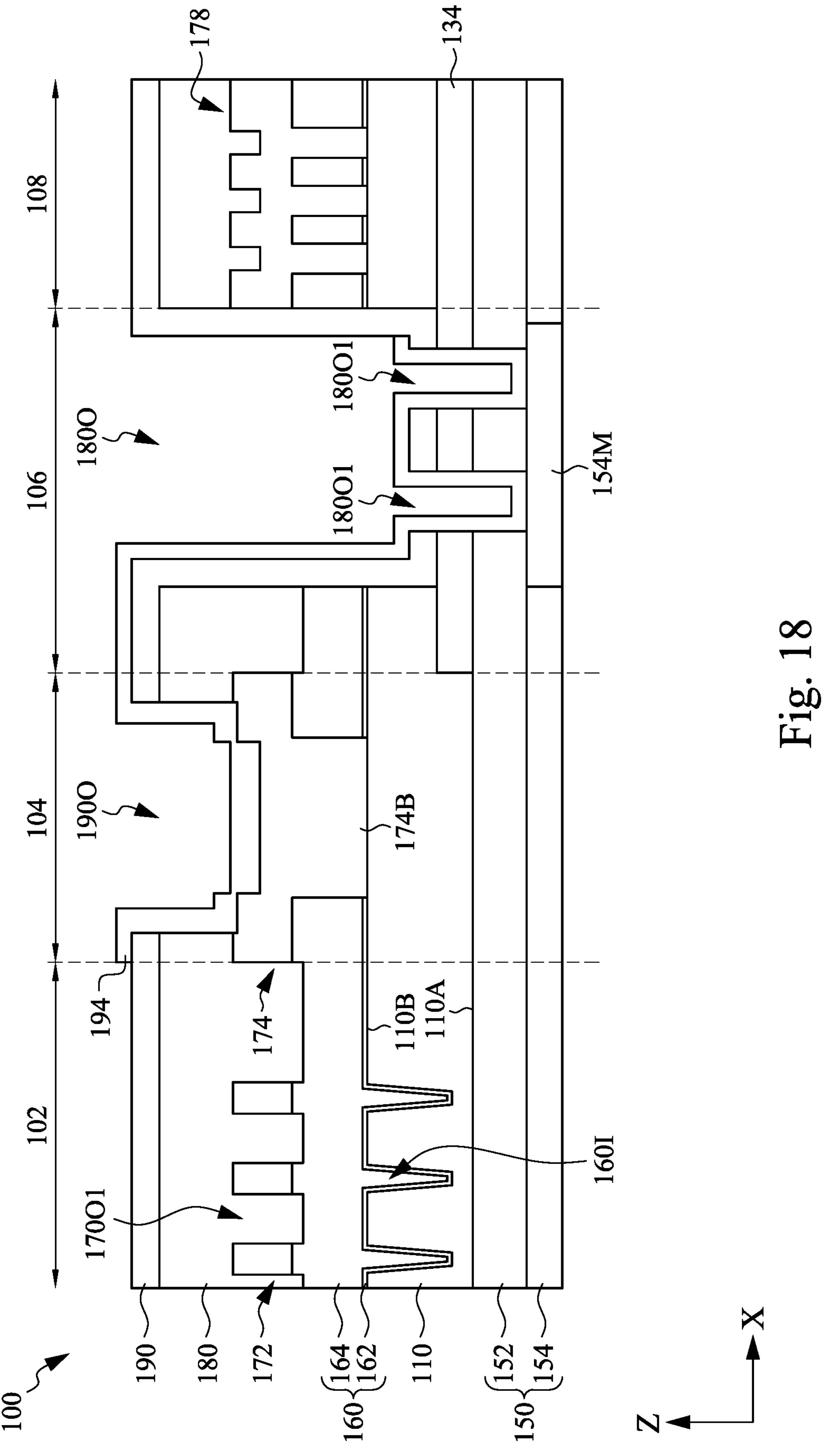

FIGS. 17 and 18 illustrates a method for forming an image sensor device 100 at various intermediate stages of manufacturing, in accordance with alternative embodiments. As shown in FIG. 17, instead of the plurality of openings 160T1, one or more larger openings 160T3 are formed in the dielectric layer 160. Next, as shown in FIG. 18, the light blocking structure 174 is formed in and over the dielectric layer 160 in the BLC region 104. The light blocking structure 174 includes one or more portions 174B, which is substantially larger than the portion 174A. Other portions of the image sensor device 100 may be substantially the same as the image sensor device 100 shown in FIG. 13. As shown in FIG. 17, the portion 174B is in contact with the substrate 110. The light blocking structure 174 includes a recess in the top surface, and the portion of the contact pad structure 194 located in the BLC region 104 fills the recess in the top surface of the light blocking structure 174.

Figures 19A, 19B:
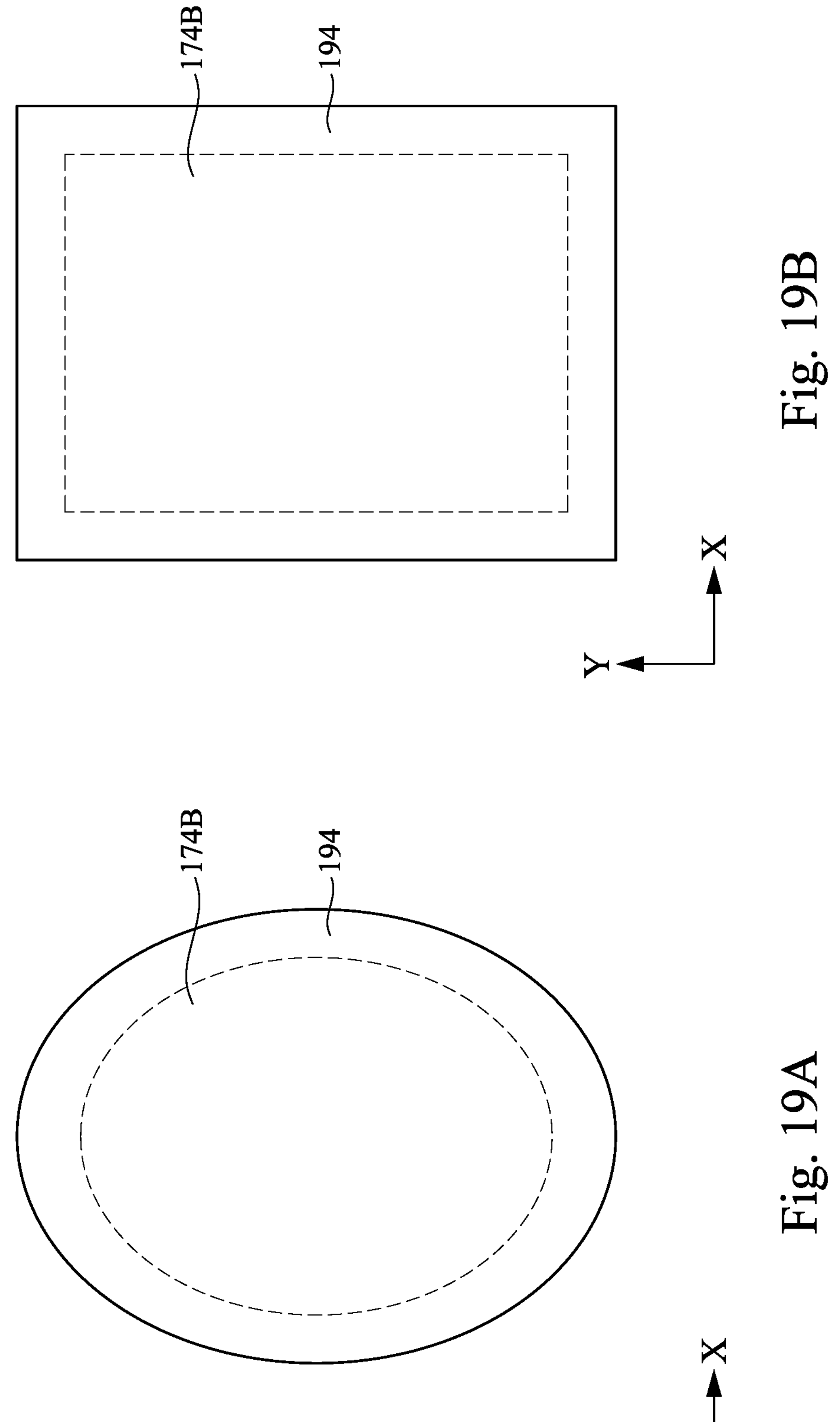
FIGS. 19A and 19B illustrate top views of a portion of a contact pad structure disposed over a light blocking structure of the image sensor device of FIG. 18, in accordance with some embodiments.

FIGS. 19A and 19B illustrate top views of a portion of the contact pad structure 194 disposed over the light blocking structure 174 of the image sensor device 100 of FIG. 18, in accordance with some embodiments. As shown in FIGS. 19A and 19B, the portions 174B of the light blocking structure 174 are shown in dashed lines because the portions 174B are located below the contact pad structure 194. The remaining portion of the light blocking structure 174 is omitted for the sake of clarity. As shown in FIG. 19A, in some embodiments, the portion 174B has an oval or circular shape, and the portion of the contact pad structure 194 located in the BLC region 104 has a similar shape as the portion 174B. The dimension of the portion of the contact pad structure 194 may be substantially larger than the dimension of the portion 174B. As shown in FIG. 19B, in some embodiments, the portion 174B has a rectangular shape, and the portion of the contact pad structure 194 located in the BLC region 104 has a similar shape as the portion 174B. The dimension of the portion of the contact pad structure 194 may be substantially larger than the dimension of the portion 174B. The shapes of the portion of the contact pad structure 194 located in the BLC region 104 and the portion 174B of the light blocking structure 174 may be substantially the same, as shown in FIGS. 19A and 19B. In some embodiments, the shapes of the portion of the contact pad structure 194 located in the BLC region 104 and the portion 174B of the light blocking structure 174 are substantially different.

Figure 20B:
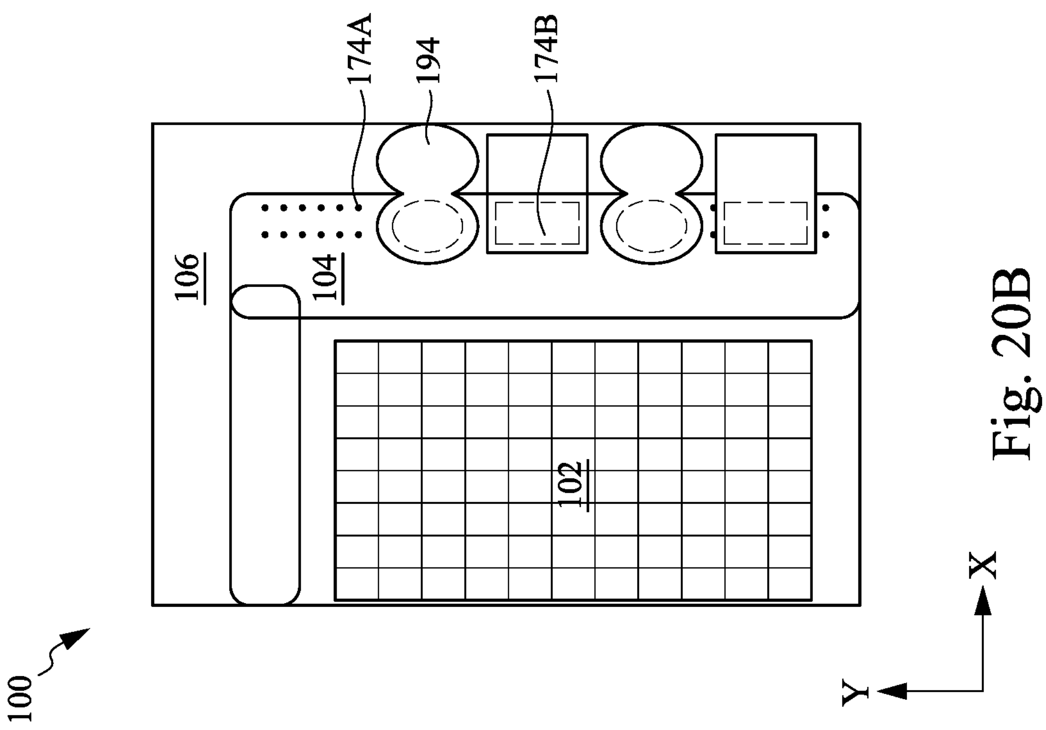
FIGS. 20A and 20B illustrate top views of a portion of the image sensor device, in accordance with some embodiments.
Figure 20A:
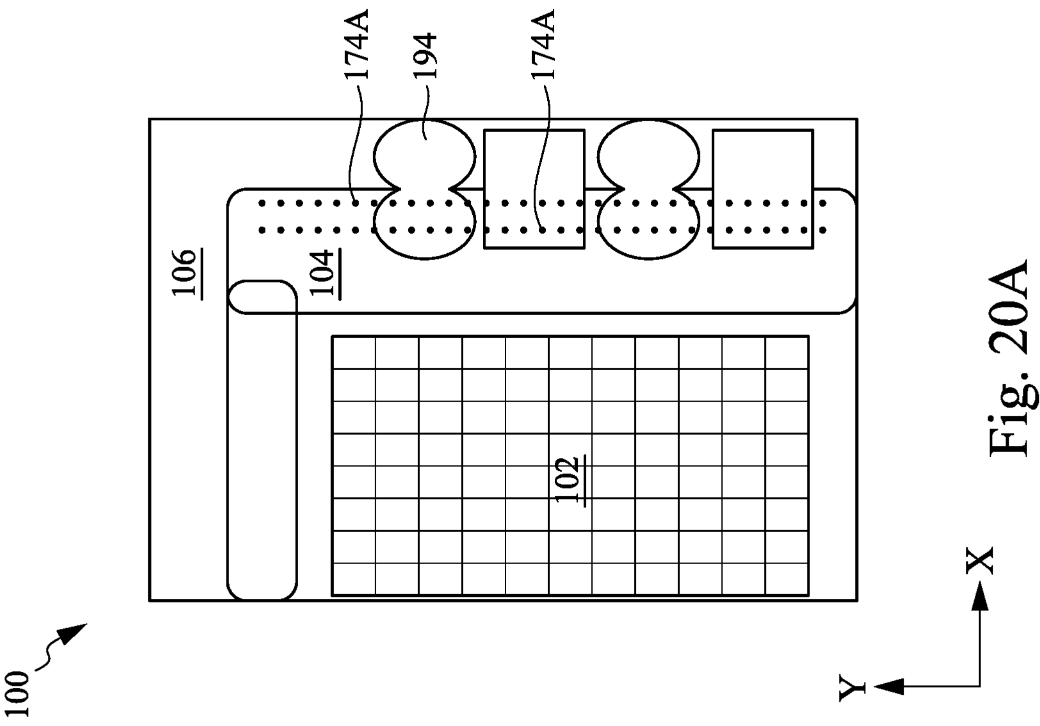

FIGS. 20A and 20B illustrate top views of a portion of the image sensor device 100, in accordance with some embodiments. As shown in FIGS. 20A and 20B, the image sensor device 100 includes the pixel array region 102, which is surrounded by the BLC region 104, which is surrounded by the contact pad region 106. As shown in FIG. 20A, the plurality of portions 174A of the light blocking structure 174 are located in the BLC region 104. The remaining portion of the light blocking structure 174 is omitted for the sake of clarity. A plurality of contact pad structures 194 are disposed over the portions 174A of the light blocking structure 174. Each contact pad structure 194 is disposed in both the BLC region 104 and the contact pad region 106. In some embodiments, each contact pad structure 194 is a continuous layer extending from the contact pad region 106 into the BLC region 104. The shape of the contact pad structure 194 may vary, as shown in FIGS. 20A and 20B. In some embodiments, the shape of the portion of the contact pad structure 194 in the contact pad region 106 is the same as the shape of the portion of the contact pad structure 194 in the BLC region 104, as shown in FIGS. 20A and 20B. In some embodiments, the shape of the portion of the contact pad structure 194 in the contact pad region 106 is different from the shape of the portion of the contact pad structure 194 in the BLC region 104. In some embodiments, multiple contact pad structures 194 having different shapes are formed in the BLC region 104 and the contact pad region 106, as shown in FIGS. 20A and 20B. In some embodiments, multiple contact pad structures 194 having the same shape are formed in the BLC region 104 and the contact pad region 106.

As shown in FIG. 20B, in some embodiments, the light blocking structure 174 includes both the portions 174A and 174B. For example, in the areas in the BLC region 104 where the contact pad structures 194 are located, the portions 174B are formed in order to increase the contact area to the substrate 110. In other areas of the BLC region 104 where no contact pad structures 194 are formed, the portions 174A are formed.

The present disclosure provides the image sensor device 100 and the method of forming the same. In some embodiments, the image sensor device 100 includes a contact pad structure 194 extending from the contact pad region 106 to the BLC region 104. The portion of the contact pad structure 194 in the BLC region 104 is electrically connected to the substrate 110. Some embodiments may achieve advantages. For example, during operation, a probe 196 is inserted into the image sensor device 100 and in contact with the portion of the contact pad structure 194 disposed in the BLC region 104, and a negative voltage applied to the ground by the probe 196 can increase the FWC by increasing energy barrier when the transfer gate (TG) is off.

An embodiment is an image sensor device. The device includes a substrate, a contact pad structure extending from a contact pad region to a black level correction region, a dielectric layer disposed over the substrate in the black level correction region, and a light blocking structure disposed on and through the dielectric layer in the black level correction region. A first portion of the contact pad structure disposed in the black level correction region is in contact with the light blocking structure, and the light blocking structure is in contact with the substrate.

Another embodiment is a method. The method includes forming one or more trenches in a pixel array region of a substrate, depositing a first dielectric layer over the substrate and in the one or more trenches, forming one or more openings in the first dielectric layer, depositing a light blocking layer over the first dielectric layer and in the one or more openings, and patterning the light blocking layer to form a light blocking structure in a black level correction region. The light blocking structure is in contact with the substrate. The method further includes forming a first opening in the first dielectric layer and the substrate in a contact pad region, depositing a conductive layer over the substrate and in the first opening, and patterning the conductive layer to form a contact pad structure. The contact pad structure extends from the contact pad region to the black level correction region.

A further embodiment is a method. The method includes depositing a first dielectric layer over a substrate, and the first dielectric layer is deposited in the pixel array region, the black level correction region, the contact pad region, and the alignment mark region. The method further includes forming openings in the first dielectric layer in the black level correction region and the alignment mark region, depositing a light blocking layer over the first dielectric layer and in the openings, removing portions of the light blocking layer in the pixel array region and the contact pad region to form a light blocking grid in the pixel array region and light blocking structures in the black level correction region and the alignment mark region, and depositing a conductive layer in the pixel array region, the black level correction region, the contact pad region, and the alignment mark region. The conductive layer is in contact with the light blocking structure in the black level correction region. The method further includes removing portions of the conductive layer in the pixel array region and the alignment mark region to form a contact pad structure extending from the contact pad region to the black level correction region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
forming one or more trenches in a pixel array region of a substrate;
depositing a first dielectric layer over the substrate and in the one or more trenches;
forming one or more openings in the first dielectric layer;
depositing a light blocking layer over the first dielectric layer and in the one or more openings;
patterning the light blocking layer to form a light blocking structure in a black level correction region, wherein the light blocking structure is in contact with the substrate;
forming a first opening in the first dielectric layer and the substrate in a contact pad region;
forming a second opening in the black level correction region to expose the light blocking structure;
depositing a conductive layer over the substrate and in the first and second openings; and
patterning the conductive layer to form a contact pad structure, wherein the contact pad structure extends from the contact pad region to the black level correction region.

2. The method of claim 1, further comprising forming an interconnect structure on the substrate and flipping over the substrate prior to forming the one or more trenches in the pixel array region of the substrate.

3. The method of claim 2, wherein the patterning the light blocking layer removes portions of the first dielectric layer.

4. The method of claim 1, further comprising depositing a second dielectric layer over the first dielectric layer after patterning the light blocking layer.

5. The method of claim 4, wherein the first opening is formed in the second dielectric layer.

6. The method of claim 5, further comprising forming a buffer oxide layer over the substrate and in the first opening prior to depositing the conductive layer, wherein the second opening is formed in the buffer oxide layer and the second dielectric layer.

7. The method of claim 6, further comprising
forming a third opening in the buffer oxide layer in the contact pad region, wherein the conductive layer is deposited in the third opening.

8. The method of claim 7, wherein the second and third openings are formed simultaneously.

9. A method, comprising:
depositing a first dielectric layer over a substrate, wherein the first dielectric layer is deposited in a pixel array region, a black level correction region, a contact pad region, and an alignment mark region;
forming openings in the first dielectric layer in the black level correction region and the alignment mark region;
depositing a light blocking layer over the first dielectric layer and in the openings;
removing portions of the light blocking layer in the pixel array region and the contact pad region to form a light blocking grid in the pixel array region and light blocking structures in the black level correction region and the alignment mark region;
depositing a second dielectric layer on the light blocking grid, the light blocking structures, and the first dielectric layer;
depositing a buffer oxide layer in the pixel array region, the black level correction region, the contact pad region, and the alignment mark region;
removing a portion of the buffer oxide layer and a portion of the second dielectric layer in the black level correction region to expose the light blocking structure in the black level correction region:
depositing a conductive layer in the pixel array region, the black level correction region, the contact pad region, and the alignment mark region, wherein the conductive layer is in contact with the light blocking structure in the black level correction region; and
removing portions of the conductive layer in the pixel array region and the alignment mark region to form a contact pad structure extending from the contact pad region to the black level correction region.

10. The method of claim 9, wherein the second dielectric layer is deposited prior to depositing the conductive layer.

11. The method of claim 10, further comprising removing a portion of the second dielectric layer, a portion of the first dielectric layer, and a portion of the substrate in the contact pad region to expose an isolation layer.

12. The method of claim 11, wherein the buffer oxide layer is in contact with the isolation layer.

13. The method of claim 11, wherein the conductive layer is electrically coupled to a conductive line located below the isolation layer.

14. A method, comprising:
depositing a first dielectric layer over a substrate, wherein the first dielectric layer is deposited in a pixel array region, a black level correction region, and a contact pad region;
removing a portion of the first dielectric layer in the contact pad region to form a first opening, wherein an isolation layer is exposed in the first opening;
removing a portion of the isolation layer to form a second opening, wherein a conductive line is exposed in the second opening;
forming a third opening over a portion of the first dielectric layer in the black level correction region, wherein the second and third openings are formed simultaneously; and
depositing a conductive layer in the first and second openings, wherein the conductive layer is a continuous layer extending from the contact pad region to the black level correction region.

15. The method of claim 14, wherein the conductive layer is electrically coupled to the conductive line.

16. The method of claim 14, further comprising forming a light blocking structure over the portion of the first dielectric layer in the black level correction region.

17. The method of claim 16, further comprising depositing a second dielectric layer on the light blocking structure in the black level correction region and on the portion of the first dielectric layer in the contact pad region.

18. The method of claim 17, wherein the first opening is formed in the second dielectric layer in the contact pad region.

19. The method of claim 18, further comprising depositing a buffer oxide layer on the second dielectric layer in the black level correction region and in the first opening in the contact pad region.

20. The method of claim 19, wherein the third opening is formed in the buffer oxide layer and the second dielectric layer, wherein the conductive layer is deposited on the light blocking structure in the black level correction region.

* * * * *